United States Patent
Takahashi

(10) Patent No.: US 11,102,895 B2
(45) Date of Patent: Aug. 24, 2021

(54) ELECTRICAL JUNCTION BOX

(71) Applicant: Sumitomo Wiring Systems, Ltd., Yokkaichi (JP)

(72) Inventor: Toru Takahashi, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 17/036,400

(22) Filed: Sep. 29, 2020

(65) Prior Publication Data
US 2021/0100114 A1  Apr. 1, 2021

(30) Foreign Application Priority Data

Sep. 30, 2019  (JP) .............................. JP2019-179683

(51) Int. Cl.
| | |
|---|---|
| *H05K 5/02* | (2006.01) |
| *B60R 16/023* | (2006.01) |
| *H05K 5/04* | (2006.01) |
| *H02G 3/08* | (2006.01) |

(52) U.S. Cl.
CPC ....... *H05K 5/0213* (2013.01); *B60R 16/0239* (2013.01); *H02G 3/081* (2013.01); *H05K 5/04* (2013.01)

(58) Field of Classification Search
CPC .............................. H05K 5/04; B60R 16/0239
See application file for complete search history.

(56) References Cited

U.S. PATENT DOCUMENTS

| | | | |
|---|---|---|---|
| 9,431,806 B2 | 8/2016 | Ueyama | |
| 2004/0223304 A1* | 11/2004 | Kobayashi | H05K 7/02 361/715 |
| 2007/0049090 A1* | 3/2007 | Kaneko | B60R 16/0239 439/271 |
| 2007/0086152 A1* | 4/2007 | Sasaki | B60R 16/0239 361/679.02 |
| 2012/0073851 A1* | 3/2012 | Takeuchi | B60R 16/0239 174/50.51 |
| 2015/0208525 A1* | 7/2015 | Negishi | H05K 5/0213 361/752 |
| 2015/0280408 A1* | 10/2015 | Anami | H02G 3/081 174/17 R |
| 2019/0281718 A1* | 9/2019 | Bessho | B60R 16/02 |

* cited by examiner

*Primary Examiner* — Hung V Ngo
(74) *Attorney, Agent, or Firm* — Honigman LLP

(57) ABSTRACT

Provided is an electrical junction box that enables suppression of entry of water even when the electrical junction box is installed in a vehicle in different orientations. Disclosed is an electrical junction box including a first case having an opening, a second case configured to cover the opening, and an accommodated component that includes a circuit assembly and is housed between the first case and the second case. The second case includes a peripheral wall formed by connecting a plurality of flat faces in a polygonal shape to cover an outer periphery of the first case adjacent to the opening. The first case includes water guard walls extending along at least two of the flat faces to cover a region not covered with the peripheral wall.

8 Claims, 10 Drawing Sheets

ELECTRICAL JUNCTION BOX

CROSS-REFERENCE TO RELATED APPLICATIONS

This application claims priority of Japanese Patent Application No. JP 2019-179683 filed on Sep. 30, 2019, the contents of which are incorporated herein.

TECHNICAL FIELD

The present disclosure relates to an electrical junction box.

BACKGROUND

A currently-used electrical junction box installed in a vehicle has a waterproofing structure to prevent entry of water while driving in rainy weather or washing the vehicle. An electrical junction box disclosed in JP 2014-27723A includes a body case having an opening at an upper edge thereof, and an upper cover configured to cover the opening of the body case. The upper cover and the body case together form a double-wall structure in which an outer wall of the body case is inserted between an outer wall and an inner wall of the upper cover. Such a double-wall structure makes the electrical junction box waterproof without using any packing between the body case and the upper cover. JP 2014-27723A is an example of related art.

Depending on the model of the vehicle, the space and the shape of the place where the electrical junction box is installed in the vehicle may differ. Accordingly, an electrical junction box corresponding to the vehicle model is typically installed in the vehicle. However, standardization of electrical junction boxes so that they can be installed in a plurality of vehicle models is preferable since such standardization achieves a reduction in the number of electrical junction box types as well as a reduction in manufacturing cost. When the electrical junction box disclosed in Patent Document 1 is installed in a plurality of vehicle models, changing the orientation of the electrical junction box in accordance with the vehicle model may possibly lead to entry of water into the electrical junction box through a gap between the body case and the upper cover.

The technique described herein was made in view of the above circumstances. An object is to provide an electrical junction box that enables suppression of entry of water even when the electrical junction box is installed in a vehicle in different orientations.

SUMMARY

An electrical junction box according to one aspect of the present disclosure includes a first case having an opening, a second case configured to cover the opening, and an accommodated component that includes a circuit assembly and is housed between the first case and the second case. The second case includes a peripheral wall formed by connecting a plurality of flat faces in a polygonal shape to cover an outer periphery of the first case adjacent to the opening. The first case includes water guard walls extending along at least two of the flat faces to cover a region not covered with the peripheral wall.

Advantageous Effects of Disclosure

With the technique disclosed in this specification, entry of water can be suppressed even when the electrical junction box is installed in a vehicle in different orientations.

DETAILED DESCRIPTION OF PREFERRED EMBODIMENTS OF THE DISCLOSURE

Figure 1:
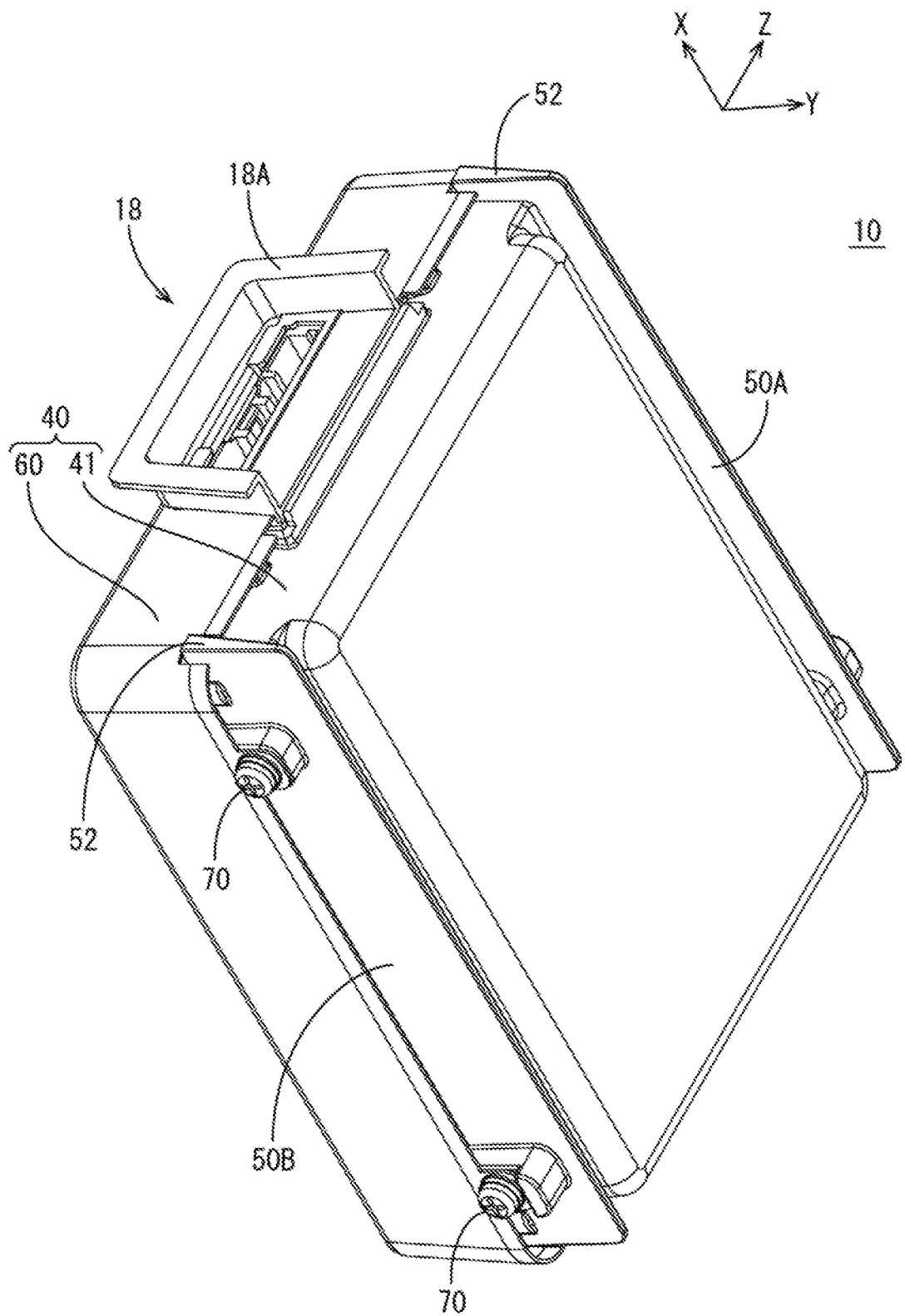
FIG. 1 is a perspective view of an electrical junction box according to one embodiment.

Initially, embodiments of the present disclosure will be listed and described.

An electrical junction box according to the present disclosure includes a first case having an opening, a second case configured to cover the opening, and an accommodated component that includes a circuit assembly and is housed between the first case and the second case. The second case includes a peripheral wall formed by connecting a plurality of flat faces in a polygonal shape to cover an outer periphery of the first case adjacent to the opening. The first case includes water guard walls extending along at least two of the flat faces to cover a region not covered with the peripheral wall.

With the configuration described above, the water guard walls of the first case are disposed along at least two of the flat faces forming the peripheral wall of the second case in the region not covered with the peripheral wall. Accordingly, even when the electrical junction box is installed in a vehicle in different orientations in accordance with a model of the vehicle, at least one of the water guard walls is positioned so as to suppress movement of water into a gap between the first case and the second case, thus keeping water from entering the electrical junction box. Consequently, entry of water into the electrical junction box can be suppressed even when the electrical junction box is installed in vehicles in different orientations in accordance with the vehicle model.

Drainage grooves may be formed inward of and along the water guard walls. This enables drainage of water with use of the drainage grooves provided inside the water guard walls.

The first case may include a housing portion that is disposed inward of the water guard walls, configured to house the accommodated component, and connected to the water guard walls, and protrusions that protrude outward with respect to the water guard walls and face the peripheral wall. This enables arrangement of the water guard walls with use of a space outside the housing portion.

The peripheral wall may be inclined with respect to the water guard walls so as to make a gap to the water guard walls larger toward a front end thereof. Such inclination of the peripheral wall enables suppression of entry of water from the gap between the first case and the second case.

The water guard walls may be disposed along opposite flat faces of the peripheral wall facing each other. This enables suppression of entry of water into the electrical junction box even when the electrical junction box is installed in the vehicle in reverse in accordance with the model of the vehicle in which the electrical junction box is installed.

The water guard walls may extend outward with respect to the peripheral wall. This enables drainage of water running over the water guard walls outward with respect to the peripheral wall.

The peripheral wall may include a passage portion that receives passage of the water guard walls. This ensures a length of the peripheral wall extending toward the first case even with the configuration in which the water guard walls perform drainage of water outward with respect to the peripheral wall. Accordingly, reduction in waterproof performance by the peripheral wall can be suppressed.

The first case and the second case are both metallic. This enables shielding of a circuit portion and easy formation of the water guard walls.

The following describes one specific example of the present disclosure with reference to the drawings. Note that the present disclosure is indicated by the scope of the claims rather than by the meaning of the above description, and all changes that come within the meaning and range of equivalency of the claims are intended to be embraced therein.

The following describes embodiments of the present disclosure with reference to FIGS. 1 to 10. An electrical junction box 10 is installed in a vehicle such as an electric vehicle and a hybrid vehicle, and is arranged in a power supply path of the vehicle. The electrical junction box 10 can be installed in various orientations with respect to the vehicle. In this embodiment, the electrical junction box 10 is fixed on an attachment member B2 of a vehicle body B1, such as a bracket, in a vertical posture (see FIG. 4). In the following description, the X direction, the Y direction, and the Z direction in FIG. 1 are regarded as the forward direction, the leftward direction, and the upward direction, respectively.

Figure 5:
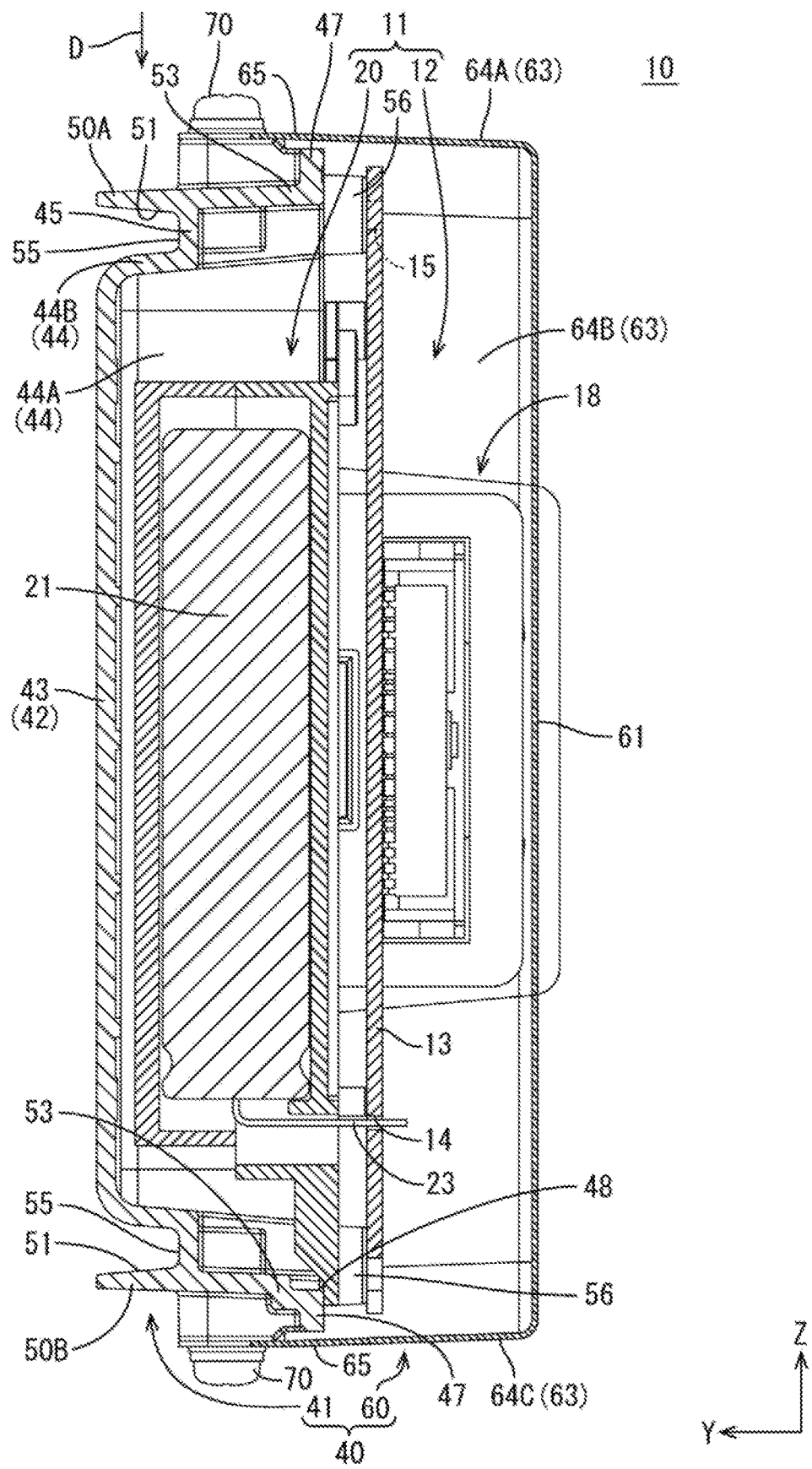
FIG. 5 is a sectional view taken along an A-A line in FIG. 4.

As shown in FIG. 5, the electrical junction box 10 includes an accommodated component 11 including a circuit assembly 12 and an electricity storage unit 20, and a metallic case 40 configured to house the accommodated component 11. The circuit assembly 12 includes a rectangular printed circuit board 13 (one example of a "substrate") formed by printing patterns of a conduction path on an insulating plate, and electronic components such as field effect transistors (FETs) and integrated circuits (ICs), not shown, that are mounted on the printed circuit board 13. The printed circuit board 13 has a plurality of through holes 14, connected to the conduction path, and a plurality of screw holes 15 passing therethrough. The through holes 14 are soldered while lead terminals 23 of the electricity storage element 21 and the like are inserted thereto. The screw holes 15 can receive insertion of screw shafts, and are disposed on a peripheral edge of the printed circuit board 13. The printed circuit board 13 is fixed on and screwed into a plurality of bosses 56 in the case 40. Here, the circuit assembly may be formed by stacking bus bars made of a metallic plate, such as copper and a copper alloy, on the printed circuit board 13, or may be formed by bus bars only without using the printed circuit board 13.

Figure 2:
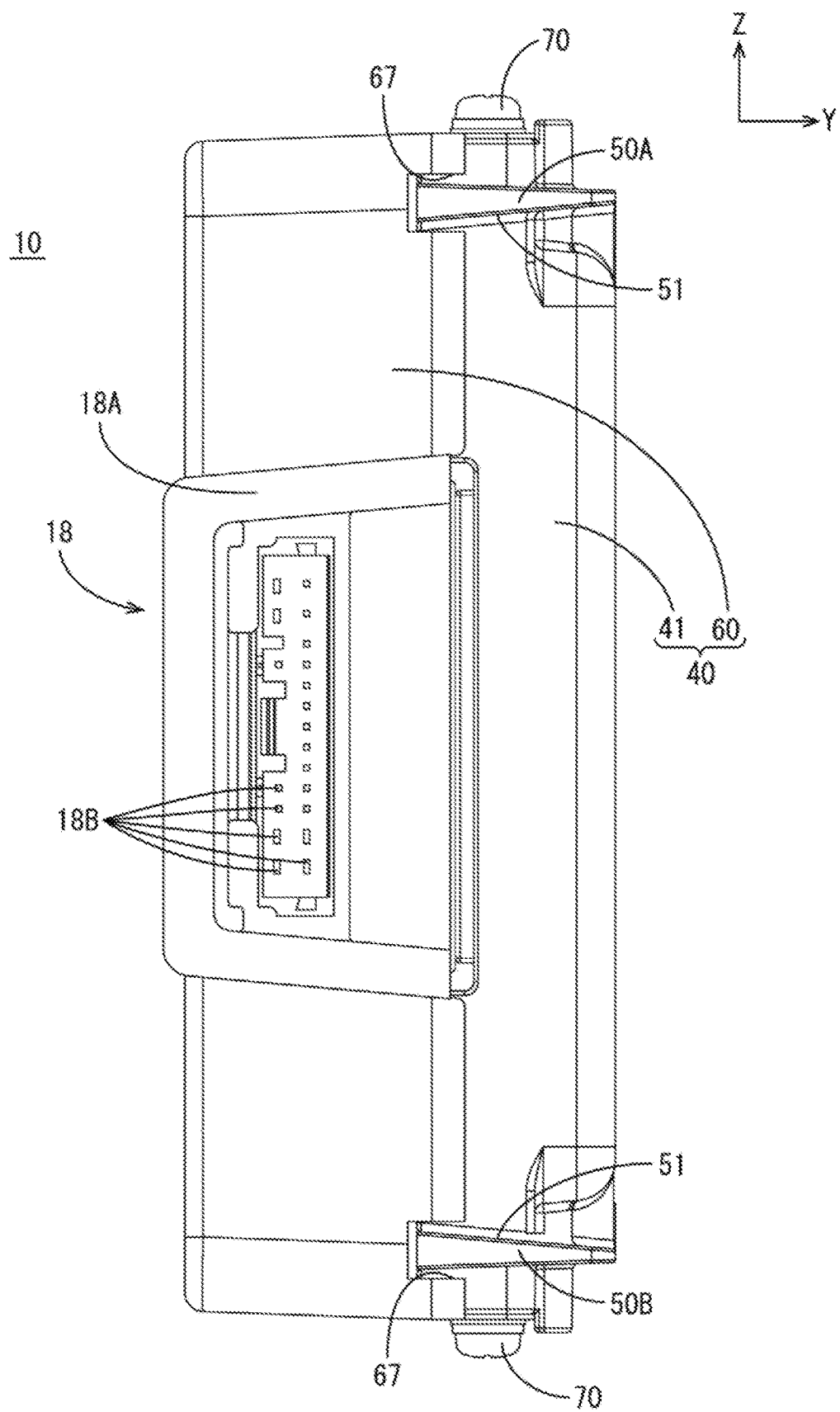
FIG. 2 is a front view of the electrical junction box.
Figure 3:
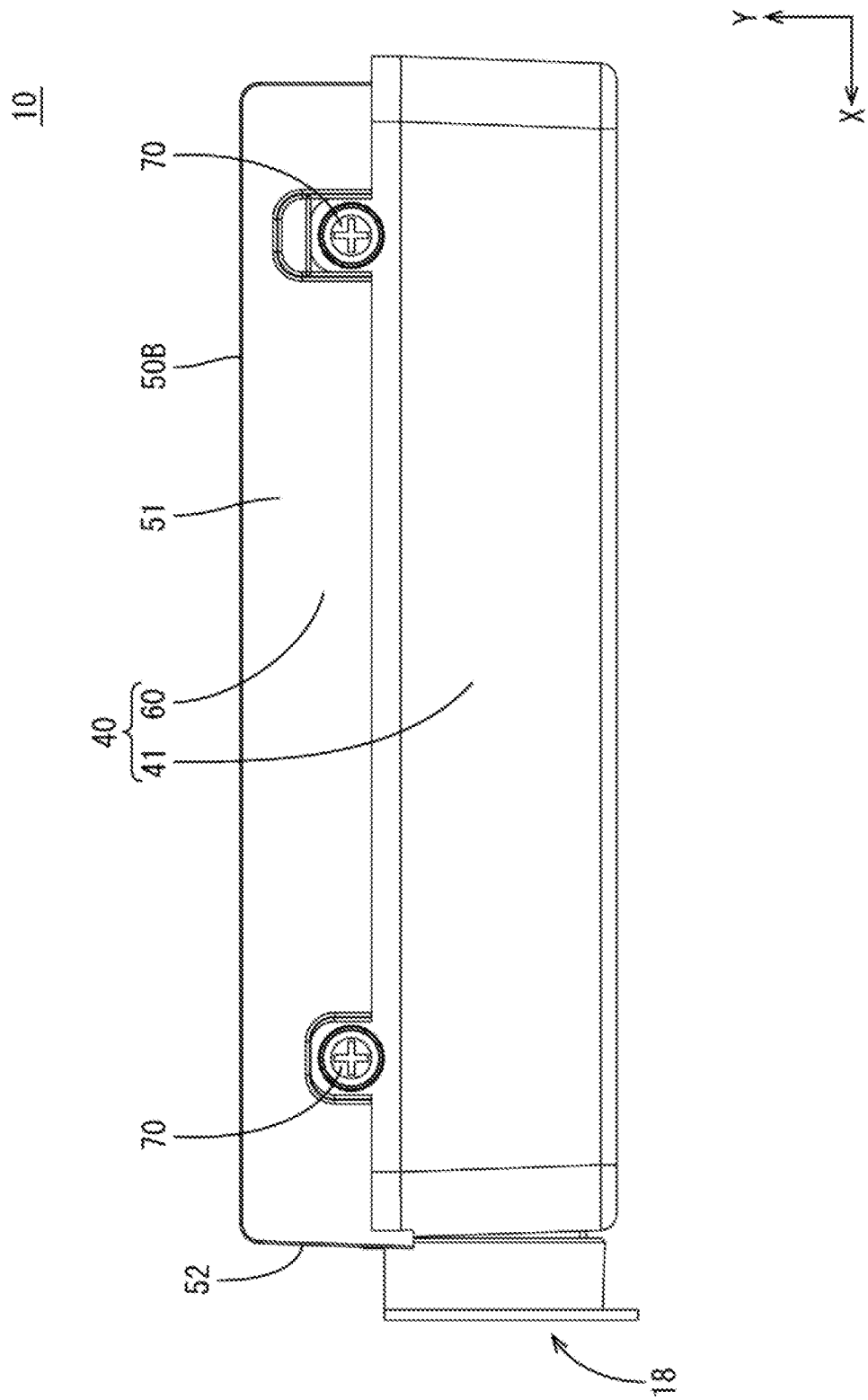
FIG. 3 is a bottom view of the electrical junction box.

A connector 18 is attached to a forward end of the printed circuit board 13. As shown in FIG. 2, the connector 18 includes a housing 18A made of synthetic resin, and connector terminals 18B passing through the housing 18A and soldered to the conduction path of the printed circuit board 13.

Figure 8:
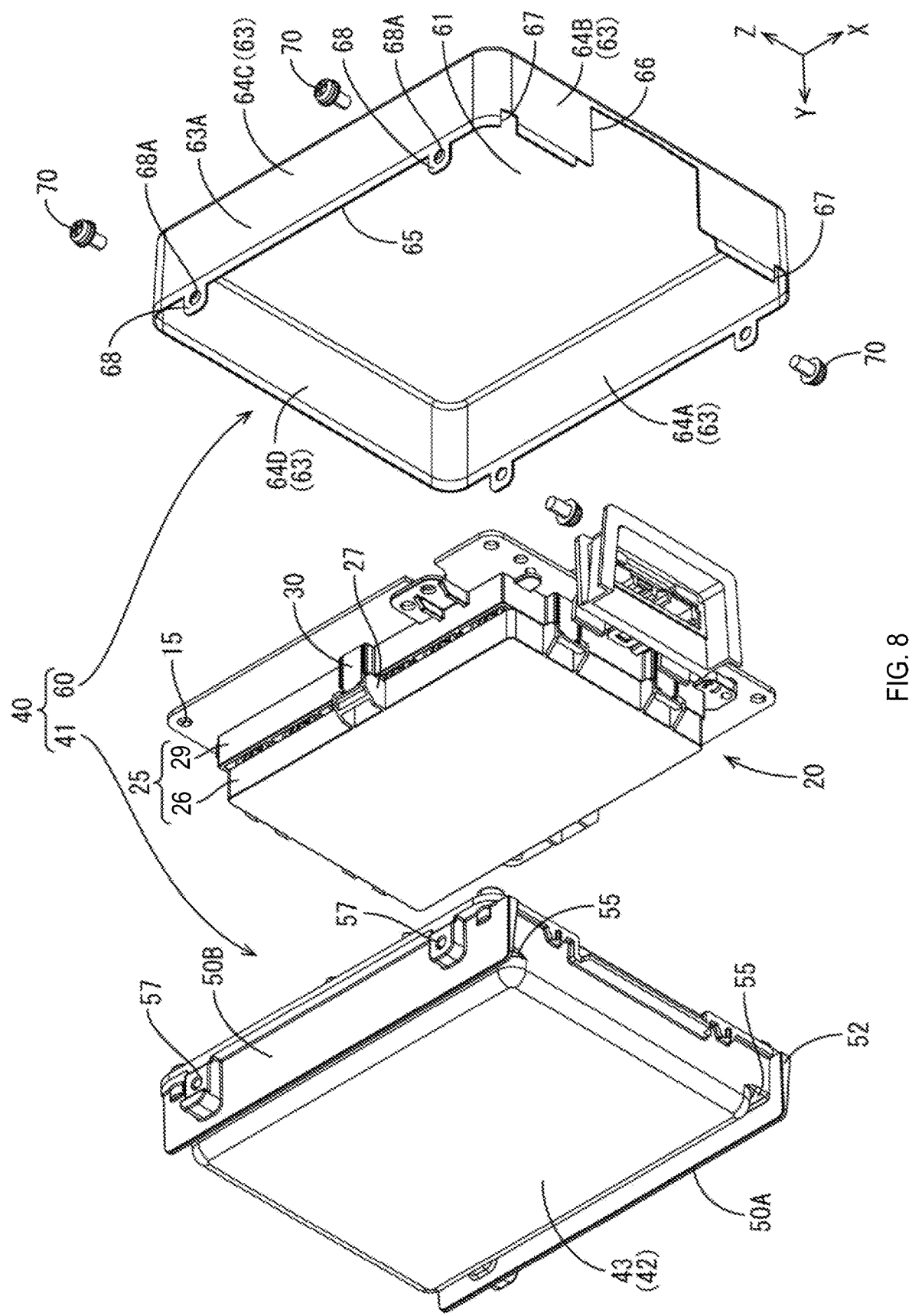
FIG. 8 is an exploded perspective view of the electrical junction box.
Figure 9:
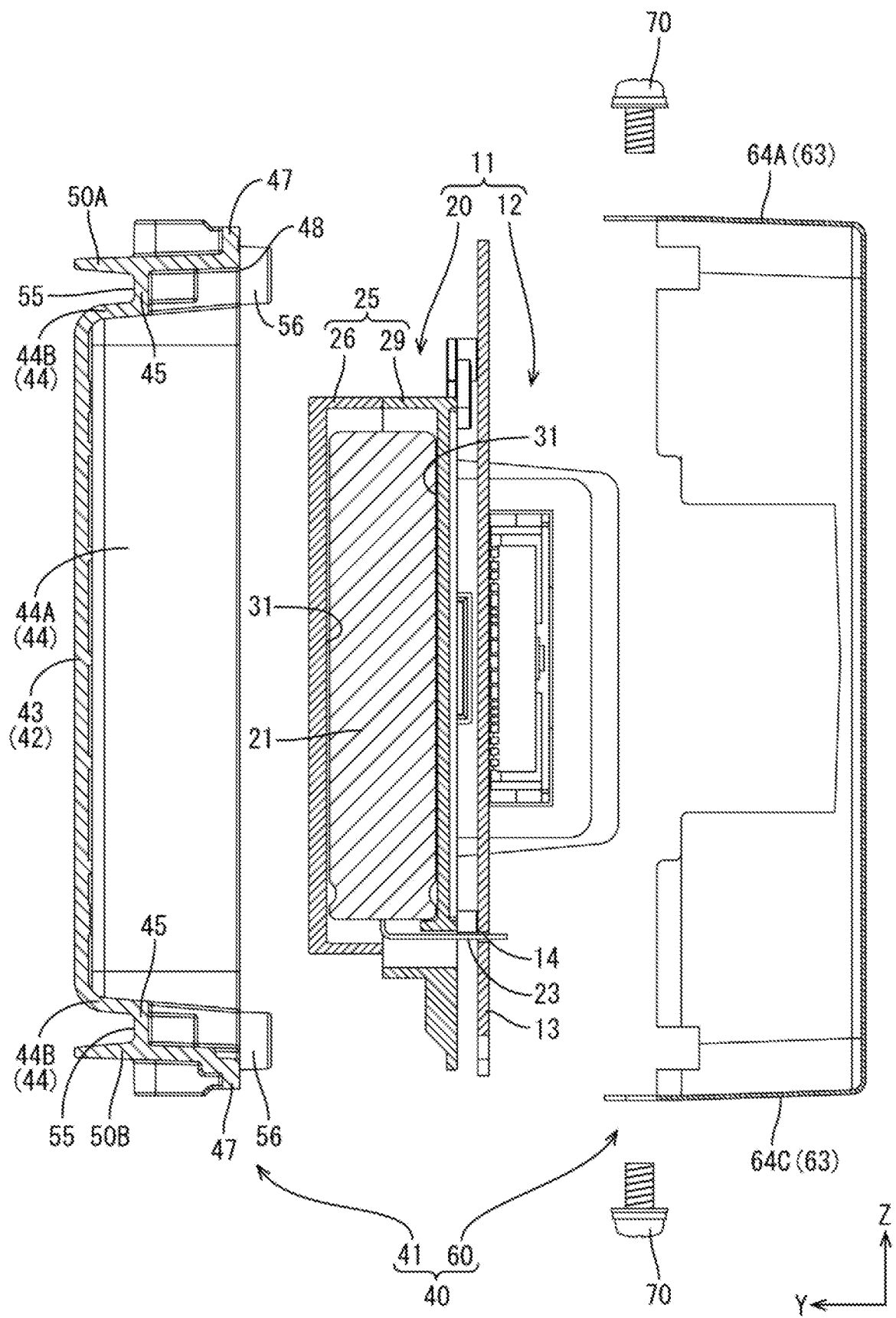
FIG. 9 is an exploded sectional view of the electrical junction box.

The electricity storage unit 20 is used as an auxiliary power source in the vehicle, for example, and includes a plurality of electricity storage elements 21 and a unit case 25 accommodating the electricity storage elements 21, as shown in FIGS. 8 and 9. The electricity storage elements 21 are, for example, capacitors, and include paired positive and negative lead terminals 23. The lead terminals 23 are arranged in line in parallel, and protrude from one of the axial end faces of a cylindrical electricity storage body in which electricity storage components, not shown, are accommodated. The lead terminals 23 are bent toward the printed circuit board 13, and are inserted into the through holes 14 of the printed circuit board 13 and soldered thereto.

The unit case 25 is made of synthetic resin, for example, and is formed by combining a pair of partitioned covers 26, 29 configured to sandwich the electricity storage elements 21 between them. The partitioned covers 26, 29 include a plurality of semiconductor fitting portions 31 that are configured to fit on outer peripheral surfaces of the electricity storage elements 21. The partitioned covers 26 and 29 are assembled by engaging a frame-shaped locked frame 27 of the partitioned cover 26 with a claw-shaped locking piece 30 of the partitioned cover 29. The partitioned cover 29 is fixed on the printed circuit board 13.

As shown in FIG. 9, the case 40 includes a first case 41 and a second case 60. The first case 41 has an opening 48 through which the electricity storage unit 20 can be inserted. The second case 60 fits externally on the first case 41 so as to cover the opening 48. The first case 41 is made of metal such as aluminum and an aluminum alloy. The first case 41 includes a housing portion 42 that enables accommodation of the electricity storage unit 20 therein, protrusions 47 that protrude outward, facing an inner face of a peripheral wall 63 of the second case 60, and a pair of water guard walls 50A, 50B disposed between the housing portion 42 and the protrusions 47.

The housing portion 42 includes a bottom face 43 having a rectangular plate shape. The bottom face 43 has a peripheral edge corresponding to an erect wall 44 that is erected in an annular shape toward the printed circuit board 13. The erect wall 44 includes lower erect walls 44B and higher erect walls 44A. The lower erect walls 44B are connected between upper and lower ends of the bottom face 43 and the water guard walls 50A, 50B, respectively. The higher erect walls 44A are higher in level than the lower erect walls 44B, and are connected between forward and rearward ends of the bottom face 43 and the protrusions 47, respectively. Connecting portions 45 connect the lower erect walls 44B and middle parts of the water guard walls 50A, 50B, respectively.

Figure 6:
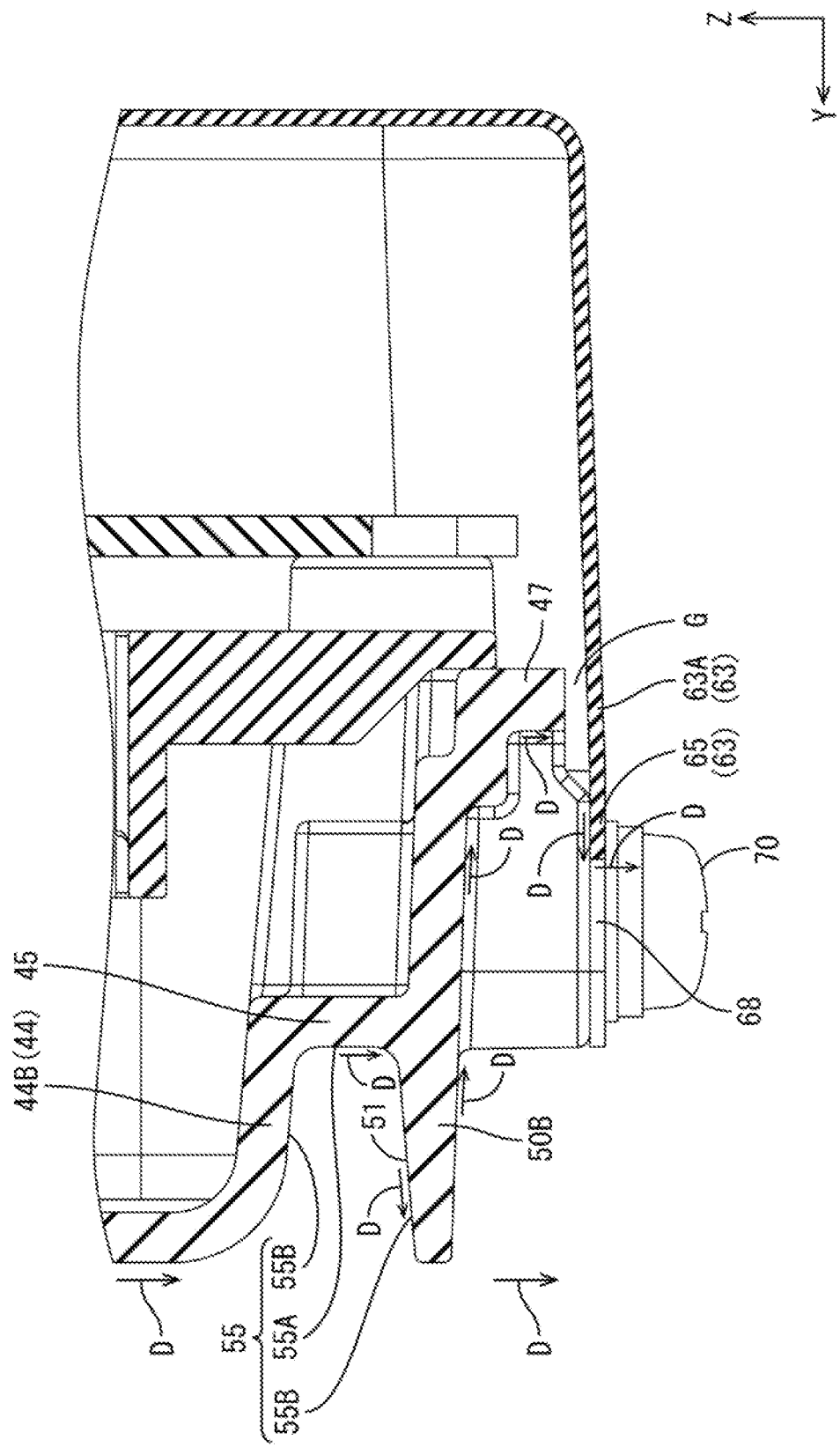
FIG. 6 is a partially enlarged view of FIG. 5.

The protrusions 47 are provided in an annular shape along an inner face of the peripheral wall 63, and inner peripheral edges of the protrusions 47 correspond to the opening 48. Here, upper and lower end portions of the annular protrusion 47 are connected to proximal end portions 53 of the water guard walls 50A, 50B. As shown in FIG. 6, a gap G is formed between the protrusions 47 and the peripheral wall 63. The gap G is provided with no waterproofing structure by packing, for example.

Figure 4:
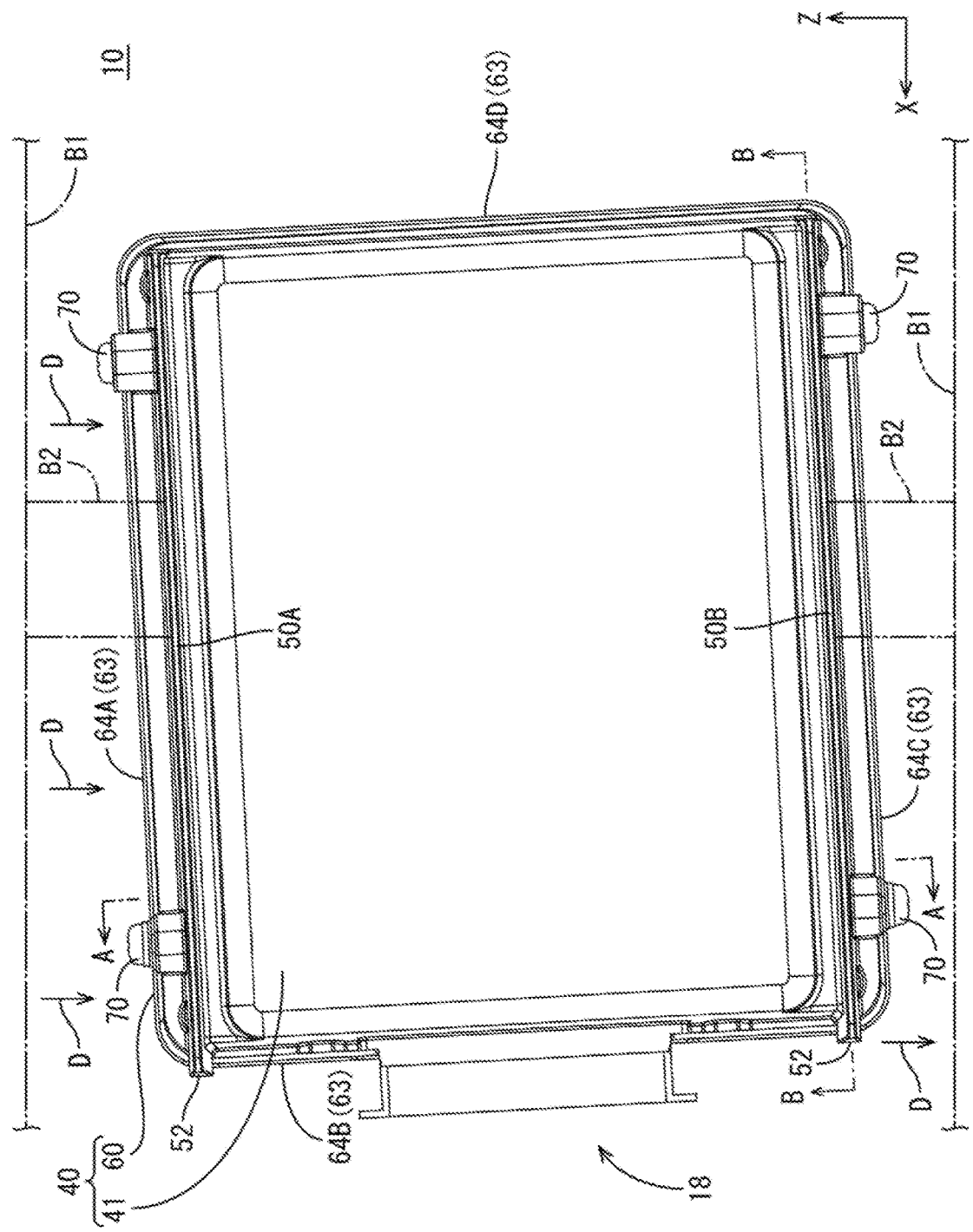
FIG. 4 is a side view of the electrical junction box in a direction where the electrical junction box is installed in a vehicle.
Figure 7:
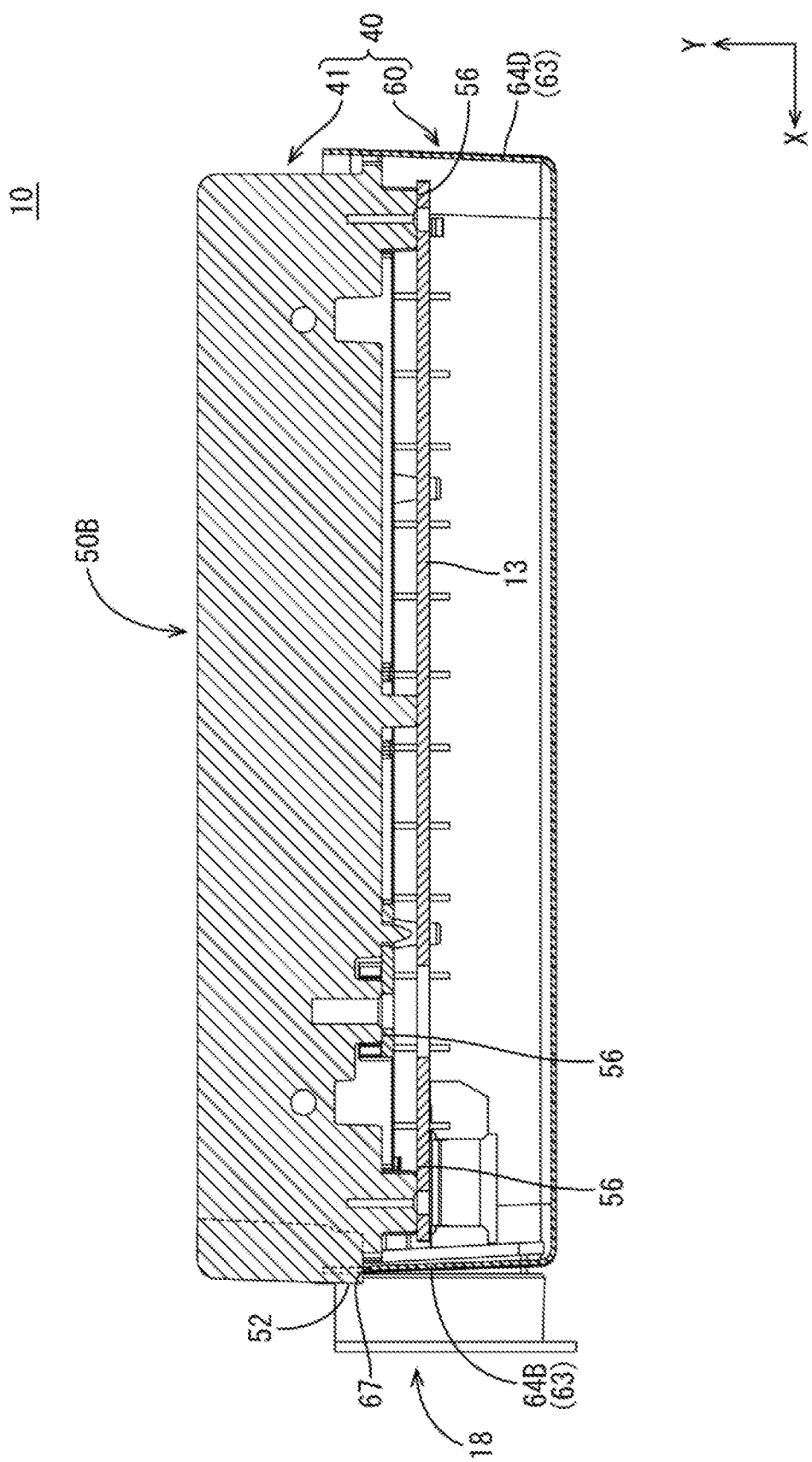
FIG. 7 is a sectional view taken along a B-B line in FIG. 4.

As shown in FIG. 4, the pair of water guard walls 50A, 50B extend in the forward/rearward direction along upper and lower flat faces 64A, 64C of the peripheral wall 63. As shown in FIG. 5, the water guard walls 50A, 50B each have a tapered plate shape whose thickness becomes smaller toward a tip end in a slope shape, and each include a slope face 51 as an inner face thereof. The water guard walls 50A, 50B protrude in a predetermined (fixed) height. The positions of the tip ends of the water guard walls 50A, 50B (i.e., tip end positions in the Y direction) are substantially equal in height to an outer face of the bottom face 43. Here, the heights of the water guard walls 50A, 50B are not limited to this. Alternatively, the tip ends of the water guard walls 50A, 50B may also protrude outward beyond the outer face of the bottom face 43. Moreover, the tip ends of the water guard walls 50A, 50B may also be shortened below the outer face of the bottom face 43. As shown in FIG. 7, terminal end portions 52 of the water guard walls 50A, 50B each extend outside of the flat face 64B (peripheral wall 63).

As shown in FIG. 5, recesses between the lower erect walls 44B (erect wall 44) and the water guard walls 50A, 50B, respectively, are drainage grooves 55. As shown in FIG. 6, the drainage grooves 55 each include a groove bottom 55A and a pair of groove walls 55B. The groove bottom 55A corresponds to an outer face of the connecting portion 45. As shown in FIG. 8, the drainage grooves 55 are formed over the entire lengths of the water guard walls 50A, 50B, except for the terminal end portion 52 thereof. The first case 41 described above made by aluminum die-casting, for example, and can be formed by pressing an aluminum alloy or the like into a mold.

The second case 60 is made of metal such as aluminum and an aluminum alloy. As shown in FIG. 8, the second case 60 includes a rectangular top board 61, and a peripheral wall 63 extending from a peripheral edge of the top board 61 in a direction that intersects with respect to the plane of the top board 61. The peripheral wall 63 includes four flat faces 64A to 64D, and is formed by connecting the four flat faces 64A to 64D circumferentially in a rectangular tube shape. The peripheral wall 63 is cut out to generate a guide portion 66 through which the connector 18 is guided outside, and a pair of passage portions 67 through which the water guard walls 50A, 50B are passed. The passage portions 67 are rectangular, and are cut out so as not to contact the water guard walls 50A, 50B when the first case 41 is assembled. The proximal ends 53 of the water guard walls 50A, 50B are inserted into the passage portions 67 with clearance.

The peripheral wall 63 includes, on its front end side, an enclosing portion 63A having a rectangular tube shape, and an extending portion 65 extending in a rectangular tube shape from a tip of the enclosing portion 63A. The enclosing portion 63A encloses the entire periphery of the protrusions 47 of the first case 41 (i.e., the entire periphery except for a part where the connector 18 is attached). As shown in FIG. 6, the enclosing portion 63A faces the protrusions 47 across the gap G. The extending portion 65 covers the water guard walls 50A, 50B adjacent to the proximal end part 53 externally. The extending portion 65 includes a tip end where a plurality of screwed portions 68 that can be fastened with screws extend in a strip shape. As shown in FIG. 8, the screwed portions 68 are arranged at intervals, and include screw holes 68A into which the shafts of the screws 70 can be screwed. The screws 70 each include a threaded shaft, and a head whose external diameter is larger than that of the shaft. The second case 60 described above can be formed by punching or bending a metallic plate with a press.

Next, a method of producing the electrical junction box 10 will be described.

As shown in FIGS. 8 and 9, the partitioned covers 26, 29 are assembled on the opposite sides of the electricity storage elements 21 to form the electricity storage unit 20 to which the connector 18 and the printed circuit board 13 having electronic components and the like mounted thereto are attached.

Next, the electricity storage unit 20 to which the printed circuit board 13 is attached is housed into the first case 41 and is screwed to the bosses 56 of the first case 41. Then, the second case 60 covers the first case 41, and the screwed portions 68 of the second case 60 are screwed to the screw holes 57 of the first case 41 with the screws 70 to form the electrical junction box 10 (FIG. 5). The electrical junction box 10 can be installed in a vehicle of one vehicle model such that the flat face 64C is directed downward as in FIG. 4, whereas the electrical junction box 10 can be installed in a vehicle of another vehicle model such that the flat face 64C is directed upward as in FIG. 10.

Next, a waterproofing function of the electrical junction box 10 will be described.

As shown in FIG. 4, the electrical junction box 10 is attached to the attachment member B2 of the vehicle body B1 in such a posture as to be inclined slightly downward toward the forward side with respect to a horizontal plane of the vehicle. Water droplets D falling from above of the electrical junction box 10 (water droplets falling in the arrow direction in FIG. 4) include one type of water droplets D having dropped on an upper surface of the flat face 64A of the peripheral wall 63. These water droplets D move toward the top board 61 due to inclination of the flat face 64A and fall downward along the top board 61. In contrast to this, another type of water droplets D having dropped on an upper surface of the water guard wall 50A of the first case 41 moves beyond the water guard wall 50A through the drainage groove 55 to the terminal end portion 52 and is drained to the outside. Another type of water droplets D having moved downward without flowing in the drainage groove 55 falls downward along the bottom face 43, moves through the drainage groove 55 on the lower side to the terminal end portion 52 to be drained to the outside, and partially falls downward from the tip end of the water guard wall 50B.

Figure 10:
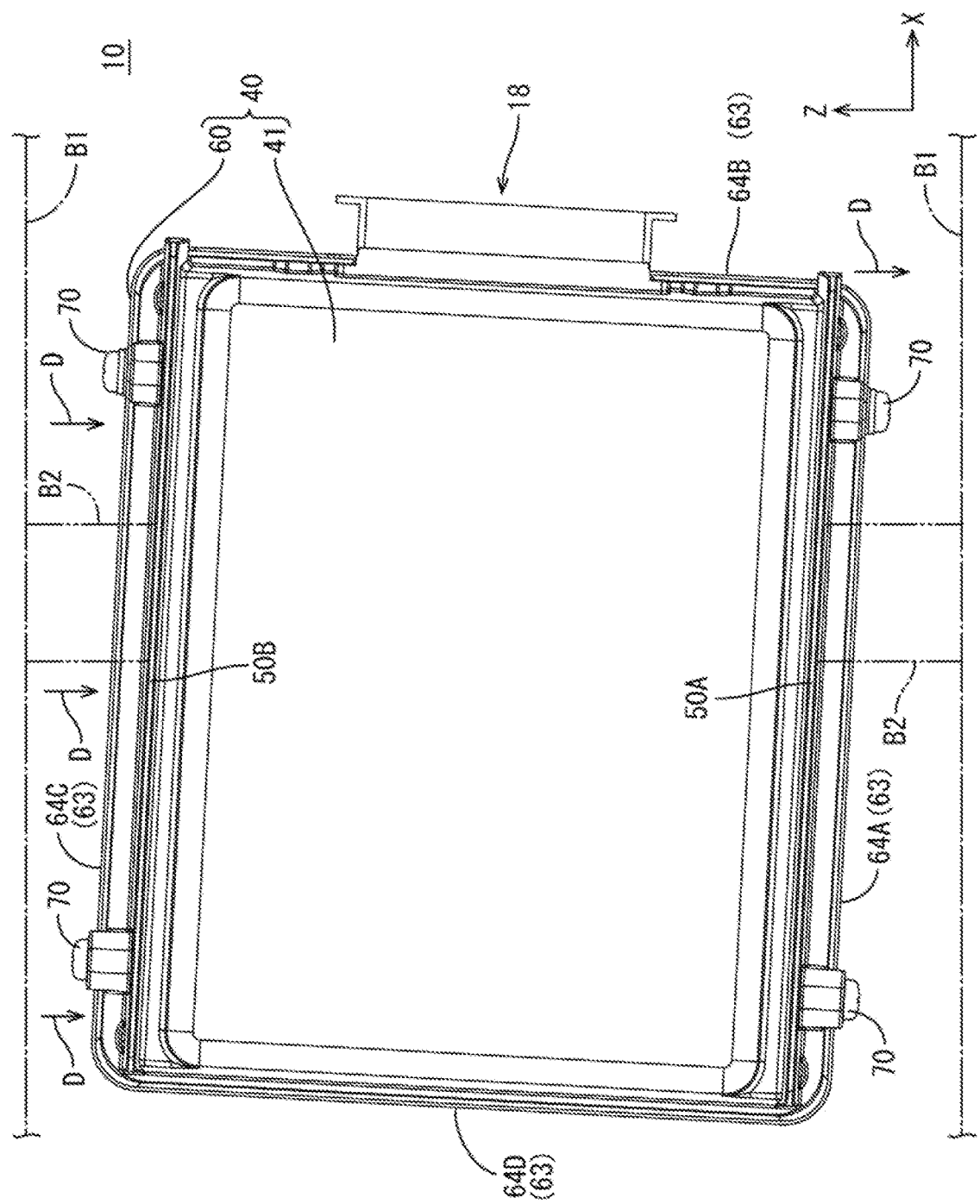
FIG. 10 is a side view of an aspect where the electrical junction box is installed in the vehicle in reverse.

Moreover, as shown in FIG. 6, a part of the water droplets D beyond the water guard wall 50B moves along the lower surface of the water guard wall 50B and drops on an inner face (upper surface) of the extending portion 65 of the peripheral wall 63. The water having dropped on the extending portion 65 moves along the inclined upper surface of the extending portion 65 toward the first case 41, and falls from the tip end of the extending portion 65. This prevents entry of water into the electrical junction box 10 (through the gap G). Moreover, similar to the above, entry of water into the electrical junction box 10 can be suppressed due to the movement of the water droplets D also in the case, as shown in FIG. 10, where the electrical junction box 10 is installed in the vehicle of another vehicle model in such a posture as to be inclined slightly downward toward the forward side with respect to the horizontal plane of the vehicle while the flat face 64A is directed downward. Furthermore, the electrical junction box 10 can be installed in the vehicle in such a manner that the top board 61 of the second case 60 is directed upward, which is not shown. In this case, the water droplets D from above can be prevented by (the extending portion 65 of) the second case 60 (independent of the water guard walls 50A, 50B).

Next, functions and effects of this embodiment will be described.

The electrical junction box 10 includes the first case 41 having the opening 48, the second case 60 configured to cover the opening 48, and the accommodated component 11 that includes the circuit assembly 12 and is housed between the first case 41 and the second case 60. The second case 60 includes the peripheral wall 63 formed by connecting a plurality of flat faces 64A to 64D in a polygonal shape to cover the outer periphery of the first case 41 adjacent to the opening 48. The first case 41 includes the water guard walls 50A, 50B extending along at least the two flat faces 64A, 64C to cover a region not covered with the peripheral wall 63. With this embodiment, the water guard walls 50A, 50B of the first case 41 are disposed along at least the two flat faces 64A, 64C of the peripheral wall 63 of the second case 60 in the region not covered with the peripheral wall 63. Accordingly, even when the electrical junction box 10 is installed in vehicles in different orientations in accordance with vehicle models, at least one water guard wall 50A (50B) is positioned so as to suppress movement of water into the gap between the first case 41 and the second case 60, thus keeping water from entering the electrical junction box 10. Consequently, entry of water into the electrical junction box 10 can be suppressed even when the electrical junction box 10 is installed in the vehicle in different orientations in accordance with vehicle models.

Moreover, the drainage grooves 55 are formed inside and along the water guard walls 50A, 50B.

This enables suppression of movement of the water droplets D into the gap between the first case 41 and the second case 60 by using the drainage grooves 55 for drain.

Moreover, the first case 41 includes the housing portion 42 that is disposed inward of the water guard walls 50A, 50B and is configured to house the accommodated component 11, the connecting portion 45 that is configured to connect the housing portion 42 and the water guard walls 50A, 50B, and the protrusions 47 that protrude outward with respect to the water guard walls 50A, 50B and face the peripheral wall 63.

This enables arrangement of the water guard walls 50A, 50B with use of the space outside the housing portion 42.

Moreover, the peripheral wall 63 is inclined so as to make a gap to the water guard walls 50A, 50B larger toward the front end thereof.

Such an inclination of the peripheral wall 63 enables suppression of entry of water from the gap between the first case 41 and the second case 60.

Moreover, the water guard walls 50A, 50B are disposed along the opposite flat faces 64A, 64C of the peripheral wall 63 facing each other.

This enables suppression of entry of water into the electrical junction box 10 even when the electrical junction box 10 is installed in the vehicle in reverse in accordance with the model of the vehicle in which the electrical junction box 10 is installed.

Moreover, the water guard walls 50A, 50B extend outward with respect to the peripheral wall 63.

This enables drainage of water running over the water guard walls 50A, 50B outward with respect to the peripheral wall 63.

Moreover, the peripheral wall 63 includes the passage portion 67 that receives passage of the water guard walls 50A, 50B.

This ensures a length of the peripheral wall 63 extending toward the first case 41 even with a configuration in which the water guard walls 50A, 50B perform drainage of water outward with respect to the peripheral wall 63. Accordingly, reduction in waterproof performance by the peripheral wall 63 can be suppressed.

Moreover, the first case 41 and the second case 60 are both metallic.

This enables shielding of the circuit portion and easy formation of the water guard walls 50A, 50B.

Other Embodiments

The technique described in the present specification is not limited to the embodiment described with the above description and drawings, and for example, the following embodiments are also encompassed with the technical scope of the technique described in the present specification.

Here, two water guard walls 50A, 50B are provided. However, there is no limitation to this. Alternatively, only one water guard wall or three or more water guard walls may be formed. In addition, the positions of the water guard walls are not limited to the sides of the first case 41 facing each other. For example, the positions are not limited to the positions facing the flat faces 64A, 64C. Alternatively, the water guard walls may be provided on positions facing the flat faces 64A, 64B or positions facing the flat faces 64A to 64D (the entire periphery of the peripheral wall 63).

The peripheral wall 63 is formed by connecting the flat faces 64A to 64D in a rectangular shape. However, there is no limitation to such a configuration. Alternatively, another configuration in which the flat faces 64A to 64D are connected in a quadrangular shape other than a rectangular shape, or in a polygonal shape other than a quadrangular shape may be employed.

The water guard walls 50A, 50B are configured to be drawn outside the peripheral wall 63. However, there is no limitation to such a configuration. Alternatively, the terminal end portions of the water guard walls 50A, 50B may be arranged inside the peripheral wall 63.

The peripheral wall 63 is configured to be inclined with respect to the water guard walls 50A, 50B. However, the peripheral wall 63 need not be inclined with respect to the water guard walls 50A, 50B. For example, the facing flat faces may also be arranged in parallel.

The electrical junction box 10 is disposed in such a posture as to be inclined to be lower toward the forward side (toward the terminal end portions 52 of the water guard walls 50A, 50B) with respect to the vehicle. However, there is no limitation to such a configuration. For example, the electrical junction box 10 may be disposed in such a posture so as to be horizontal with respect to the vehicle (a posture in which the water guard walls 50A, 50B are arranged horizontally).

The electricity storage elements 21 are included as the accommodated component 11. However, an electrical junction box where no electricity storage element 21 is housed may be made. Moreover, the electricity storage elements 21 are capacitors, but there is no limitation to this. For example, a battery such as a lithium-ion secondary battery may be used.

What is claimed is:

1. An electrical junction box, comprising:
   a first case having an opening;
   a second case configured to cover the opening; and
   an accommodated component that includes a circuit assembly and is housed between the first case and the second case,
   the second case including a peripheral wall formed by connecting a plurality of flat faces in a polygonal shape to cover an outer periphery of the first case adjacent to the opening, and
   the first case including water guard walls extending along at least two of the flat faces to cover a region not covered with the peripheral wall.

2. The electrical junction box according to claim 1, wherein drainage grooves are formed inward of and along the water guard walls.

3. The electrical junction box according to claim 1, wherein the first case includes:
- a housing portion that is disposed inward of the water guard walls, configured to house the accommodated component, and connected to the water guard walls; and
- protrusions that protrude outward with respect to the water guard walls and face the peripheral wall.

4. The electrical junction box according to claim 1, wherein the peripheral wall is inclined with respect to the water guard walls so as to make a gap to the water guard walls larger toward a front end thereof.

5. The electrical junction box according to claim 1, wherein the water guard walls are disposed along opposite flat faces of the peripheral wall facing each other.

6. The electrical junction box according to claim 1, wherein the water guard walls extend outside with respect to the peripheral wall.

7. The electrical junction box according to claim 6, wherein the peripheral wall includes a passage portion that receives passage of the water guard walls.

8. The electrical junction box according to claim 1, wherein the first case and the second case are both metallic.

\* \* \* \* \*